(12) United States Patent
Wang et al.

(10) Patent No.: US 9,019,753 B2
(45) Date of Patent: Apr. 28, 2015

(54) TWO-PORT SRAM WRITE TRACKING SCHEME

(71) Applicant: Taiwan Semiconductor Manufacturing Company, Ltd., Hsinchu (TW)

(72) Inventors: Bing Wang, Palo Alto, CA (US); Kuoyuan (Peter) Hsu, San Jose, CA (US); Derek C. Tao, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/094,833

(22) Filed: Dec. 3, 2013

(65) Prior Publication Data

US 2014/0092675 A1    Apr. 3, 2014

Related U.S. Application Data

(63) Continuation of application No. 12/839,624, filed on Jul. 20, 2010, now Pat. No. 8,619,477.

(51) Int. Cl.
*G11C 11/419* (2006.01)
*G11C 11/413* (2006.01)

(52) U.S. Cl.
CPC ............ *G11C 11/419* (2013.01); *G11C 11/413* (2013.01)

(58) Field of Classification Search
None
See application file for complete search history.

(56) References Cited

U.S. PATENT DOCUMENTS 5,689,471 A    11/1997    Voss et al.
5,715,201 A *   2/1998    Khieu .......................... 365/191

* cited by examiner

*Primary Examiner* — James G Norman
(74) *Attorney, Agent, or Firm* — Lowe Hauptman & Ham, LLP

(57) ABSTRACT

A write tracking control circuit includes an input node, and a first transistor configured to pre-charge a word bit line connected to at least two memory cells. The write tracking control circuit further includes a second transistor configured to pre-charge a read bit line connected to the at least two memory cells. The write tracking control circuit further includes a first delay circuit between the input node and the first transistor, the first delay circuit configured to introduce a first delay time, wherein a gate of the first transistor is connected to the first delay circuit. The write tracking control circuit further includes a second delay circuit between the input node and the second transistor, the second delay circuit configured to introduce a second delay time different from the first delay time, wherein a gate of the second transistor is connected to the second delay circuit.

20 Claims, 3 Drawing Sheets

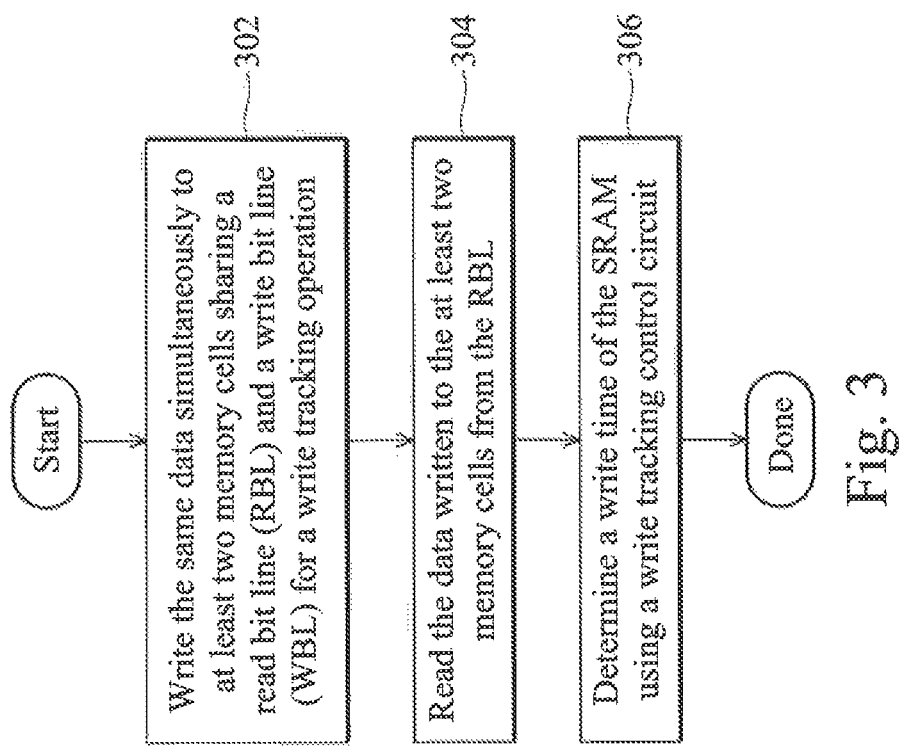

TWO-PORT SRAM WRITE TRACKING SCHEME

PRIORITY CLAIM

The present application is a continuation of U.S. application Ser. No. 12/839,624, filed Jul. 20, 2010, which is incorporated by reference herein in its entirety.

TECHNICAL FIELD

The present disclosure relates generally to an integrated circuit, more particularly a memory circuit.

BACKGROUND

For a Static Random Access Memory (SRAM), its write time can be determined using a write tracking circuit or an emulation memory cell. From the write time, the width of a word line pulse for a write operation can be determined. In conventional methods, the write tracking circuit or an emulation memory cell, used with logic transistors outside of a memory array area, cannot provide accurate write tracking when the logic device and memory cell are located at different process, voltage, and temperature (PVT) corners. Also, with different circuit loading, e.g., capacitance, and different device behavior, e.g., current, device speed, etc., from the actual memory array, an accurate write tracking can be difficult.

Accordingly, new circuits and methods are desired to solve the above problems.

BRIEF DESCRIPTION OF THE DRAWINGS

Reference is now made to the following descriptions taken in conjunction with the accompanying drawings, in which:

FIG. 3 is a flow diagram showing an exemplary method for the SRAM with the write tracking control circuit shown in FIG. 1.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
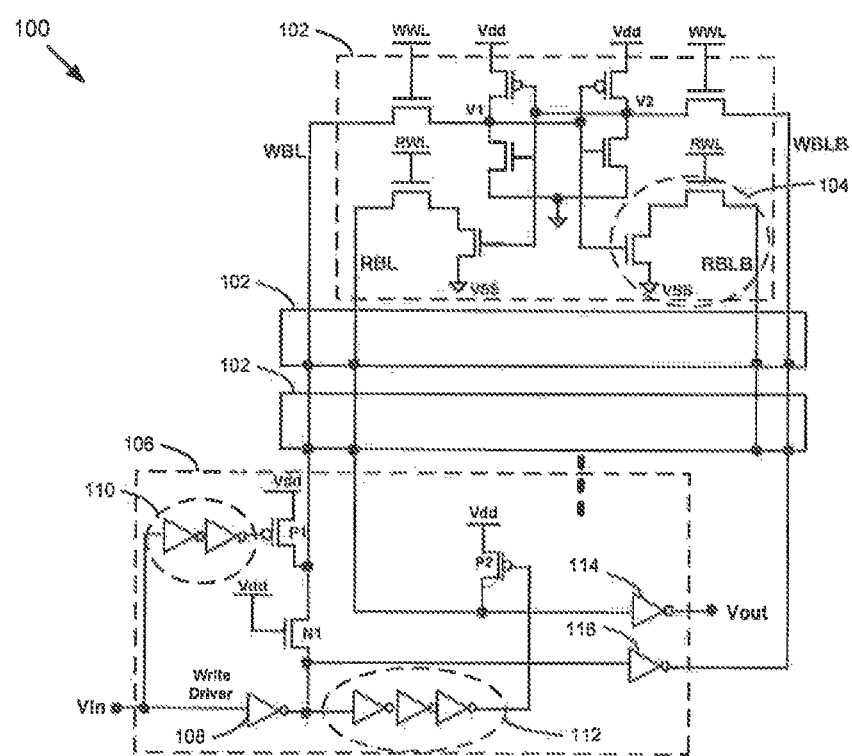
FIG. 1 is a schematic diagram showing an exemplary SRAM with a write tracking control circuit according to some embodiments.

FIG. 1 is a schematic diagram showing an exemplary SRAM with a write tracking control circuit according to some embodiments. The SRAM 100 includes memory cells 102 and a write tracking control circuit 106. The SRAM 100 has a separate read bitline (RBL) and write bitline (WBL), thus is a two-port memory. The memory cell 102 in this example includes ten transistors with connections to RBL, read bitline bar (RBLB), read wordline (RWL), WBL, write bitline bar (WBLB), and write wordline (WWL). The two transistors 104 coupled to the read bitline bar (RBLB) can be removed to reduce the number of transistors in the memory cell 102 to eight. The WBL (and/or WBLB) has multiple memory cells connected, e.g., 64, 128, etc. depending on embodiments.

The write tracking control circuit 106 includes PMOS transistors P1 and P2, an NMOS transistor N1, inverters 108, 114, and 116, two cascaded inverters 110, three cascaded inverters 112. The PMOS transistors P1 and P2 are used to precharge WBL and RBL, respectively. The NMOS transistor N1 is coupled to a select multiplexer (now shown) that selects (i.e., enables) the WBL, and is shown to be connected to Vdd in FIG. 1, indicating that the WBL is enabled for the write tracking operation in this example. Two cascaded inverters 110 are intended to match the time delay of Vin signal to the PMOS transistor P1 through the inverter 108 and the NMOS transistor N1. The three cascaded inverters 112 are intended to match the time delay from the output of the inverter 108 to the PMOS transistor P2 through the NMOS transistor N1 and the transistors in the memory cell 102. However, different delays can be used depending on embodiments. The write tracking control circuit 106 is connected to the memory cells 102 with WBL, WBLB, RBL, and RBLB.

For the operation of write tracking using the write tracking control circuit 106, the write wordlines (WWL) and read wordlines (RWL) of a given number of multiple memory cells 102, e.g., top five memory cells, are connected together and asserted, e.g., coupled to a power supply voltage Vdd. The multiple memory cells 102, e.g., the top 5 memory cells, are written with the same data simultaneously (at the same time). Also, the RBL of the multiple memory cells 102, e.g., the top five memory cells, are connected together and share the RBL for the write tracking operation.

The number of the multiple memory cells 102 for which the WWL, RWL, and RBL are connected together can be determined based on the speed of the write tracking (to determine the WWL pulse width in a normal write operation) and the transistor junction loading effect from connecting them together. By coupling multiple memory cells 102 together for the write tracking operation, the reading speed from RBL can be improved due to the combined current capability of multiple memory cells 102. On the other hand, as the number of connected memory cells 102 increases, the transistor junction loading, e.g., capacitance, can also increase to slow down the reading speed from RBL.

Figure 2:
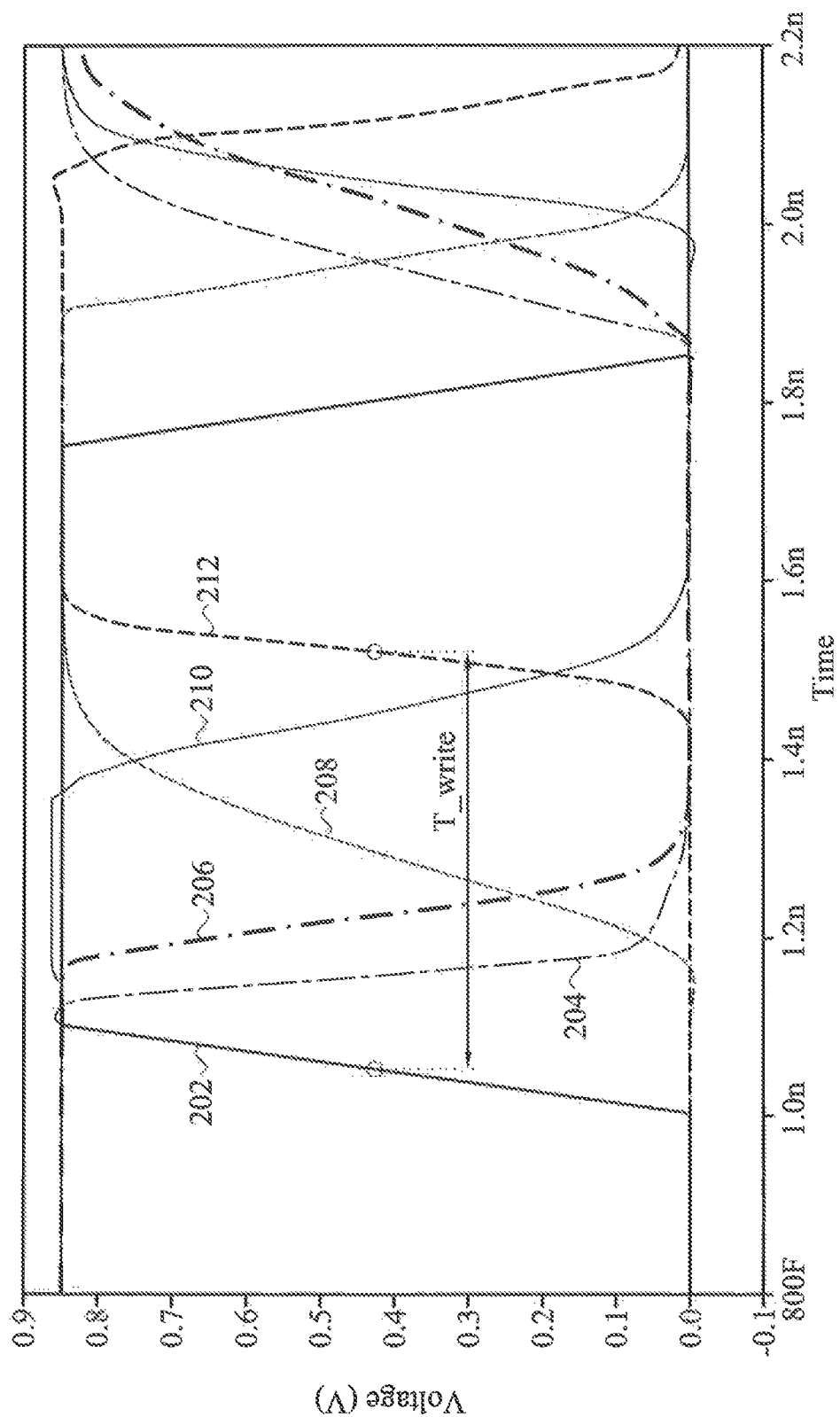
FIG. 2 is a plot showing various waveforms for signal voltages of the SRAM with a write tracking control circuit shown in FIG. 1 during a write tracking operation.

FIG. 2 is a plot showing various waveforms for signal voltages of the SRAM with a write tracking control circuit shown in FIG. 1 during a write tracking operation. Initially when the input voltage (Vin) is a logical 0 for a non-write cycle, WBLB and the voltage V2 are also a logical 0 because of the two inverters 108 and 116. The WBL and voltage V1 have a logical 1, precharged by the PMOS transistor P1. And RBL has a logical 1, precharged by the PMOS transistor P2.

During a write cycle, with Vin shown as the waveform 202 changing from a logical 0 to a logical 1 as shown in FIG. 2, the NMOS transistor N1 pulls down WBL waveform 204 to a logical 0, and V1 waveform 206 to a logical 0. V2 waveform 208 (and WBLB) changes from a logical 0 to a logical 1 as Vin passes through the two inverters 108 and 116. RBL waveform 210 becomes a logical 0 to reflect the stored information in the memory cell 102, e.g., V1 and/or V2. The output voltage Vout shown as the waveform 212 becomes a logical 1 after the inverter 114. The write time T_write is estimated as the time delay between the Vin and Vout voltage changes and an appropriate WWL pulse width for a normal write operation of the SRAM 100 can be determined from T_write. The write tracking control circuit is coupled to both WBL and WBLB, and can emulate the worst-case write operation.

Because actual memory cells 102 inside the SRAM 100 cell array are used for write tracking, the write time can be determined more precisely, compared to using circuits outside of the memory array area. Also, separate write tracking control circuit 106 can be implemented for different memory array chips in a wafer, thus write time at each chip can be determined separately taking PVT corners into consideration.

During the write cycle, the same data is written into multiple memory cells 102 at the same time. Since the memory cells 102's read ports are connected together, e.g., RBL, to monitor when the writing is completed, the RBL is pull down by multiple read transistors in the memory cells 102, to minimize the RBL pull down time and the Vout time delay. Also, because the write operation is performed on multiple memory cells 102, thus the write tracking can monitor the average write time of the memory cells 102.

FIG. 3 is a flow diagram showing an exemplary method for the SRAM with the write tracking control circuit shown in FIG. 1. At step 302, the same data is written simultaneously to at least two memory cells sharing a read bit line (RBL) and a write bit line (WBL) for a write tracking operation. At step 304, the data written to the at least two memory cells are read from the RBL. At step 306, a write time of the SRAM is determined using a write tracking control circuit.

An input voltage Vin can be received for the data to be written to the at least two memory cells by the write tracking control circuit. An output voltage Vout can be provided for the data read from the RBL by the write tracking control circuit. Read word lines (RWL) and write word lines (WWL) of the at least two memory cells can be asserted for the write tracking operation. An average write time of the at least two memory cells can be provided by the write tracking control circuit. The pulse width for WWL of the SRAM for a normal write operation can be determined by the write tracking control circuit.

One aspect of this description relates to a write tracking control circuit. The write tracking control circuit includes an input node, and a first transistor configured to pre-charge a word bit line connected to at least two memory cells. The write tracking control circuit further includes a second transistor configured to pre-charge a read bit line connected to the at least two memory cells. The write tracking control circuit further includes a first delay circuit between the input node and the first transistor, the first delay circuit configured to introduce a first delay time, wherein a gate of the first transistor is connected to the first delay circuit. The write tracking control circuit further includes a second delay circuit between the input node and the second transistor, the second delay circuit configured to introduce a second delay time different from the first delay time, wherein a gate of the second transistor is connected to the second delay circuit.

Another aspect of this description relates to a write tracking control circuit which includes an input node configured to receive an input signal. The write tracking control circuit further includes a first transistor configured to receive a first delayed input signal, a first terminal of the first transistor connected to at least two memory cells, wherein the first delayed input signal is delayed by a first delay time relative to the input signal. The write tracking control circuit further includes a second transistor configured to receive a second delayed input signal, a first terminal of the second transistor connected to the at least two memory cells, wherein the second delayed input signal is delayed by a second delay time relative to the input signal, and the second delay time is different from the first delay time. The write tracking control circuit further includes an output node configured to output an output signal, wherein the output node is connected to the first terminal of the second transistor.

Still another aspect of this description relates to a write tracking control circuit which includes an input node. The write tracking control circuit further includes a first p-type metal oxide semiconductor (PMOS) transistor configured to pre-charge a word bit line connected to at least two memory cells. The write tracking control circuit further includes a second PMOS transistor (P2) configured to pre-charge a read bit line connected to the at least two memory cells. The write tracking control circuit further includes a first delay circuit between the input node and the first transistor, the first delay circuit configured to introduce a first delay time, wherein a gate of the first transistor is connected to the first delay circuit. The write tracking control circuit further includes a second delay circuit between the input node and the second transistor, the second delay circuit configured to introduce a second delay time different from the first delay time, wherein a gate of the second transistor is connected to the second delay circuit. The write tracking control circuit further includes an output node, wherein the output node is connected to a terminal of the second transistor.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the disclosure is intended to include within their scope such processes, machines, manufacture, compositions of matter, means, methods, or steps.

The above method embodiments show exemplary steps, but they are not necessarily required to be performed in the order shown. Steps may be added, replaced, changed order, and/or eliminated as appropriate, in accordance with the spirit and scope of embodiment of the disclosure.

What is claimed is:

1. A write tracking control circuit comprising:
   an input node (Vin);
   a first transistor (P1) configured to pre-charge a word bit line (WBL) connected to at least two memory cells;
   a second transistor (P2) configured to pre-charge a read bit line (RBL) connected to the at least two memory cells;
   a first delay circuit between the input node and the first transistor, the first delay circuit configured to introduce a first delay time, wherein a gate of the first transistor is connected to the first delay circuit; and
   a second delay circuit between the input node and the second transistor, the second delay circuit configured to introduce a second delay time different from the first delay time, wherein a gate of the second transistor is connected to the second delay circuit.

2. The write tracking control circuit of claim 1, wherein the second delay time is greater than the first delay time.

3. The write tracking control circuit of claim 1, wherein the first delay circuit comprises a plurality of inverters.

4. The write tracking control circuit of claim 1, wherein the second delay circuit comprises a plurality of inverters.

5. The write tracking control circuit of claim 1, further comprising an output node (Vout), wherein a terminal of the second transistor is connected to the output node.

6. The write tracking control circuit of claim 5, further comprising an inverter between the terminal of the second transistor and the output node.

7. The write tracking control circuit of claim 1, wherein a terminal of the first transistor is selectively connected to the second delay circuit.

8. The write tracking control circuit of claim 7, further comprising a third transistor (N1) between the terminal of the first transistor and the second delay circuit.

9. The write tracking control circuit of claim 8, wherein the third transistor is an n-type metal oxide semiconductor (NMOS) transistor.

10. The write tracking control circuit of claim 1, wherein the first transistor is a p-type metal oxide semiconductor (PMOS) transistor and the second transistor is a PMOS transistor.

11. A write tracking control circuit comprising:
an input node (Vin) configured to receive an input signal;
a first transistor (P1) configured to receive a first delayed input signal, a first terminal of the first transistor connected to at least two memory cells (102), wherein the first delayed input signal is delayed by a first delay time relative to the input signal;
a second transistor (P2) configured to receive a second delayed input signal, a first terminal of the second transistor connected to the at least two memory cells, wherein the second delayed input signal is delayed by a second delay time relative to the input signal, and the second delay time is different from the first delay time; and
an output node (Vout) configured to output an output signal, wherein the output node is connected to the first terminal of the second transistor.

12. The write tracking control circuit of claim 11, wherein the second delay time is greater than the first delay time.

13. The write tracking control circuit of claim 11, further comprising a first delay circuit between the input node and the first transistor, wherein the first delay circuit is configured to delay the input signal by the first delay time.

14. The write tracking control circuit of claim 11, further comprising a second delay circuit between the input node and the second transistor, wherein the second delay circuit is configured to delay the input signal by the second delay time.

15. The write tracking control circuit of claim 11, further comprising an inverter between the first terminal of the second transistor and the output node.

16. The write tracking control circuit of claim 11, wherein the first terminal of the first transistor is selectively connected to the second transistor.

17. The write tracking control circuit of claim 16, further comprising a third transistor (N1) between the terminal of the first transistor and the second transistor.

18. A write tracking control circuit comprising:
an input node (Vin);
a first p-type metal oxide semiconductor (PMOS) transistor (P1) configured to pre-charge a word bit line (WBL) connected to at least two memory cells;
a second PMOS transistor (P2) configured to pre-charge a read bit line (RBL) connected to the at least two memory cells;
a first delay circuit between the input node and the first transistor, the first delay circuit configured to introduce a first delay time, wherein a gate of the first transistor is connected to the first delay circuit;
a second delay circuit between the input node and the second transistor, the second delay circuit configured to introduce a second delay time different from the first delay time, wherein a gate of the second transistor is connected to the second delay circuit; and
an output node (Vout), wherein the output node is connected to a terminal of the second transistor.

19. The write tracking control circuit of claim 18, wherein the second delay time is greater than the first delay time.

20. The write tracking control circuit of claim 18, further comprising an n-type metal oxide semiconductor (NMOS) transistor between a terminal of the first PMOS transistor and the second delay circuit, wherein the NMOS transistor is configured to selectively connect the terminal of the PMOS transistor and the second delay circuit.

* * * * *